US012777604B2

(12) United States Patent
O'Donnell et al.

(10) Patent No.: US 12,777,604 B2
(45) Date of Patent: Oct. 27, 2026

(54) ADAPTIVE RACK DOOR

(71) Applicant: Dell Products L.P., Round Rock, TX (US)

(72) Inventors: Sean P. O'Donnell, Poughkeepsie, NY (US); Richard Andrew Crisp, Austin, TX (US); Daniel Alvarado, Pflugerville, TX (US); Julian Yu-Hao Chen, Austin, TX (US); Nicholas Lenn Poteracki, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 125 days.

(21) Appl. No.: 18/782,340

(22) Filed: Jul. 24, 2024

(65) Prior Publication Data

US 2026/0032847 A1 Jan. 29, 2026

(51) Int. Cl.
*H05K 7/14* (2006.01)

(52) U.S. Cl.
CPC .................................. *H05K 7/1488* (2013.01)

(58) Field of Classification Search
CPC ...................... H05K 7/1488; E06B 2003/7096
See application file for complete search history.

(56) References Cited

U.S. PATENT DOCUMENTS 4,319,431 A * 3/1982 Siers ...................... B61D 19/00 49/501
4,607,455 A * 8/1986 Bluem .................... E06B 11/02 49/55
4,884,614 A * 12/1989 Spurling ................... E06B 9/04 49/55
5,771,505 A * 6/1998 Reynolds ............... A47K 3/001 49/55
5,924,242 A * 7/1999 Macari ...................... E06B 9/02 49/55
6,233,874 B1 * 5/2001 Johnson, Jr. ........ E05B 65/0007 49/55
7,438,638 B2 * 10/2008 Lewis .................. H05K 9/0041 361/679.48
7,595,985 B2 * 9/2009 Adducci ................ H04Q 1/062 165/122
8,578,656 B2 * 11/2013 Yates ........................ E06B 9/06 49/55
9,313,927 B2 * 4/2016 Krietzman ......... H05K 7/20836
(Continued)

FOREIGN PATENT DOCUMENTS

CH 519088 A * 2/1972
CN 107165543 A * 9/2017 ............ E06B 11/026
(Continued)

*Primary Examiner* — Hanh V Tran
(74) *Attorney, Agent, or Firm* — WOMBLE BOND DICKINSON (US) LLP

(57) ABSTRACT

Devices, systems, and methods for securing electronic racks are disclosed. The electronic racks may be securing using adaptable rack doors. The rack doors may include width adjustment features. The width adjustment features may be used to place a rack door into compatibility with an electronic rack. The width adjustment features may enable different portions of the rack door to be repositioned with respect to one another to modify a width of the rack door. The adaptable rack door may also include features to enable it to be opened from the left or right hand side.

20 Claims, 10 Drawing Sheets

(56) References Cited

U.S. PATENT DOCUMENTS

| | | | | |
|---|---|---|---|---|
| 10,104,798 | B2 * | 10/2018 | AbuGhazaleh | H05K 7/18 |
| 10,694,636 | B2 * | 6/2020 | Ivey | H04R 1/026 |
| 10,934,769 | B2 * | 3/2021 | Flannery | E06B 9/04 |
| 2004/0080244 | A1 * | 4/2004 | Lowther, Jr. | A47B 57/10<br>312/223.1 |
| 2014/0317902 | A1 * | 10/2014 | Helbig | H05K 7/20736<br>29/700 |
| 2021/0345509 | A1 * | 11/2021 | Marcus | E05D 7/123 |
| 2022/0381086 | A1 * | 12/2022 | Roberts | E06B 11/02 |
| 2025/0203821 | A1 * | 6/2025 | Prats | H05K 7/20709 |

FOREIGN PATENT DOCUMENTS

| | | | | | |
|---|---|---|---|---|---|
| DE | 202017003161 | U1 | * | 11/2017 | E06B 3/90 |
| DE | 102019001906 | A1 | * | 9/2020 | E06B 3/70 |
| GB | 2569525 | A | * | 6/2019 | H05K 7/186 |
| KR | 20200012722 | A | * | 2/2020 | E05F 11/34 |
| WO | WO-2008027304 | A2 | * | 3/2008 | E06B 9/04 |

* cited by examiner

400

ADAPTIVE RACK DOOR

FIELD OF THE DISCLOSURE

Embodiments disclosed herein generally relate to securing of data processing systems. More particularly, embodiments disclosed herein relate to systems and methods to secure data processing systems using rack doors.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
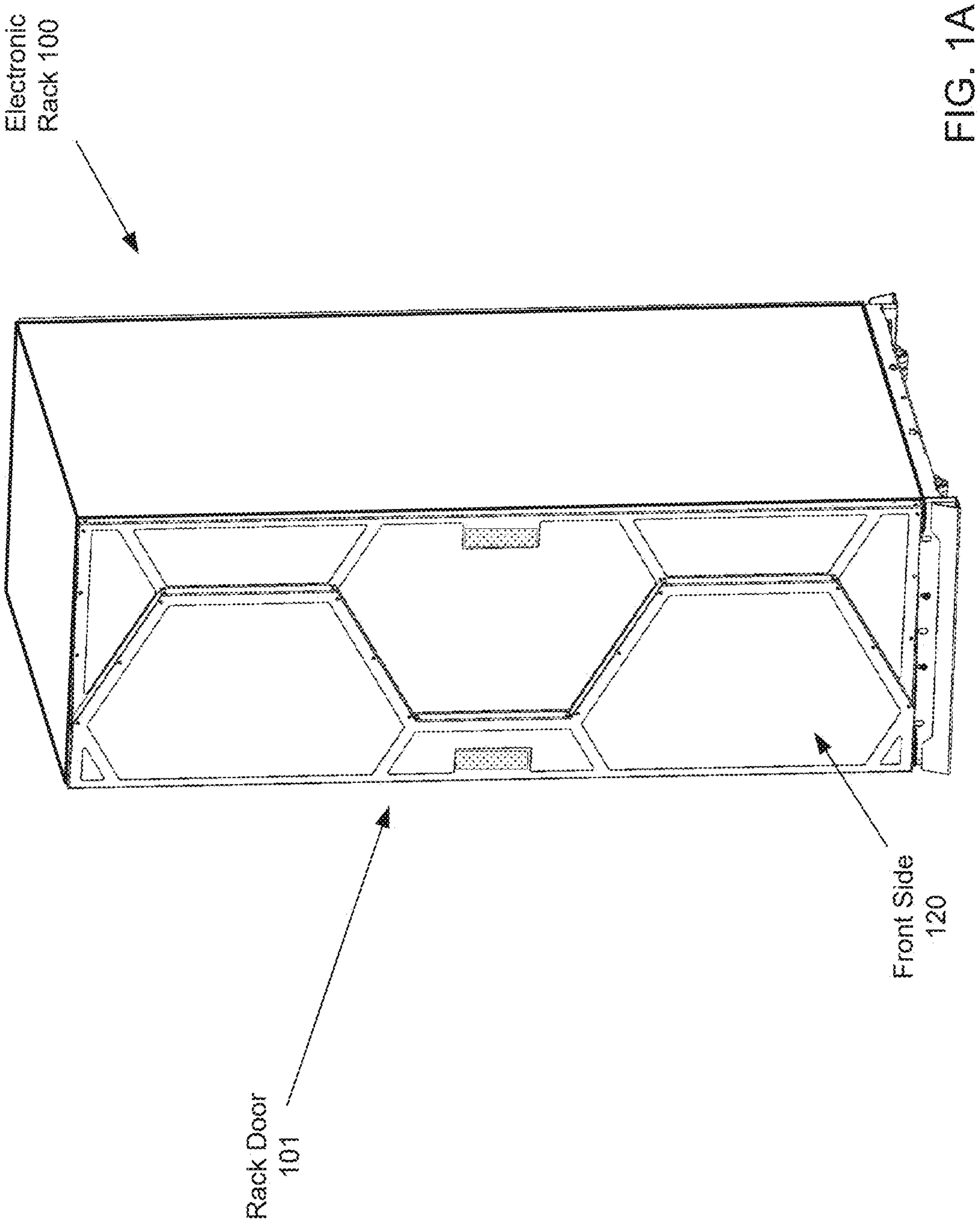
FIGS. 1A-1B show diagrams illustrating an electronic rack in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to devices, systems, and methods for securing data processing systems. The data processing systems may be positioned in an electronic rack. The data processing systems may be secured using an adaptable rack door. The adaptable rack door may include features that allow for a width and opening side of the rack door to be modified. Consequently, the rack door may be adjusted based on the electronic rack (e.g., to match its width) and/or to meet goals for a data center environment (e.g., a particular opening side).

In an embodiment, an electronic rack is provided. The electronic rack may include a frame comprising an area for housing chassis that are each adapted to house a respective data processing system; and a rack door that is attached to the frame and adapted to selectively restrict access to the area, the rack door may include at least one width adjustment system adapted to adjust a width of the rack door.

The rack door may also include a first panel; and a second panel.

The first panel may include a perforated portion; and an edge that is connected to and delineates the perforated portion.

The perforated portion may include perforated sheet metal. The edge may include a reinforcing member that retains a shape of the perforated sheet metal.

The at least one width adjustment system may be adapted to adjust the width of the rack door between a first width and a second width.

While the width of the door is adjusted to the first width, a first edge of the first panel may be aligned with a second edge of the second panel.

While the width of the door is adjusted to the first width, a perforated portion of the first panel may not overlap with a perforated portion of the second panel.

While the width of the door is adjusted to the second width, the first edge of the first panel may not be aligned with the second edge of the second panel.

While the width of the door is adjusted to the second width, the perforated portion of the first panel may at least partially overlaps with the perforated portion of the second panel.

The at least one width adjustment system may include a structural member of the first panel; a structural member of the second panel; and a securing mechanism to reversibly fixedly attach the structural member of the first panel to the structural member of the second panel.

The at least one width adjustment system may include two width adjustment system, a first of the two width adjustment systems being positioned with a top of the first panel and a top of the second panel, and a second of the two width adjustment systems being positioned with a bottom of the first panel and a bottom of the second panel.

The rack door may also include a handle movable between a first handle area of the first panel and a second handle area of the second panel.

The rack door may further include a locking mechanism adapted to: be positioned with the first handle area and the second handle area, and reversibly fixedly secure the rack door to the frame.

In an embodiment, a rack door for an electronic rack is provided. The rack door may include at least one width adjustment system adapted to adjust a width of the rack door to conform to a width of the electronic rack, and a front side adapted to: restrict physical access to an area of the electronic rack while the rack door is: positioned with the electronic rack, and in a closed position.

The rack door may also include a first panel; and a second panel.

The first panel may include a perforated portion; and an edge that is connected to and delineates the perforated portion.

The perforated portion may include perforated sheet metal. The edge may include a reinforcing member that retains a shape of the perforated sheet metal.

The at least one width adjustment system may be adapted to adjust the width of the rack door between a first width and a second width.

While the width of the door is adjusted to the first width, a first edge of the first panel may be aligned with a second edge of the second panel.

While the width of the door is adjusted to the first width, a perforated portion of the first panel may not overlap with a perforated portion of the second panel.

In an embodiment, a method of securing data processing systems is provided. The method may include adjusting of a width of a rack door.

Figure 1B:
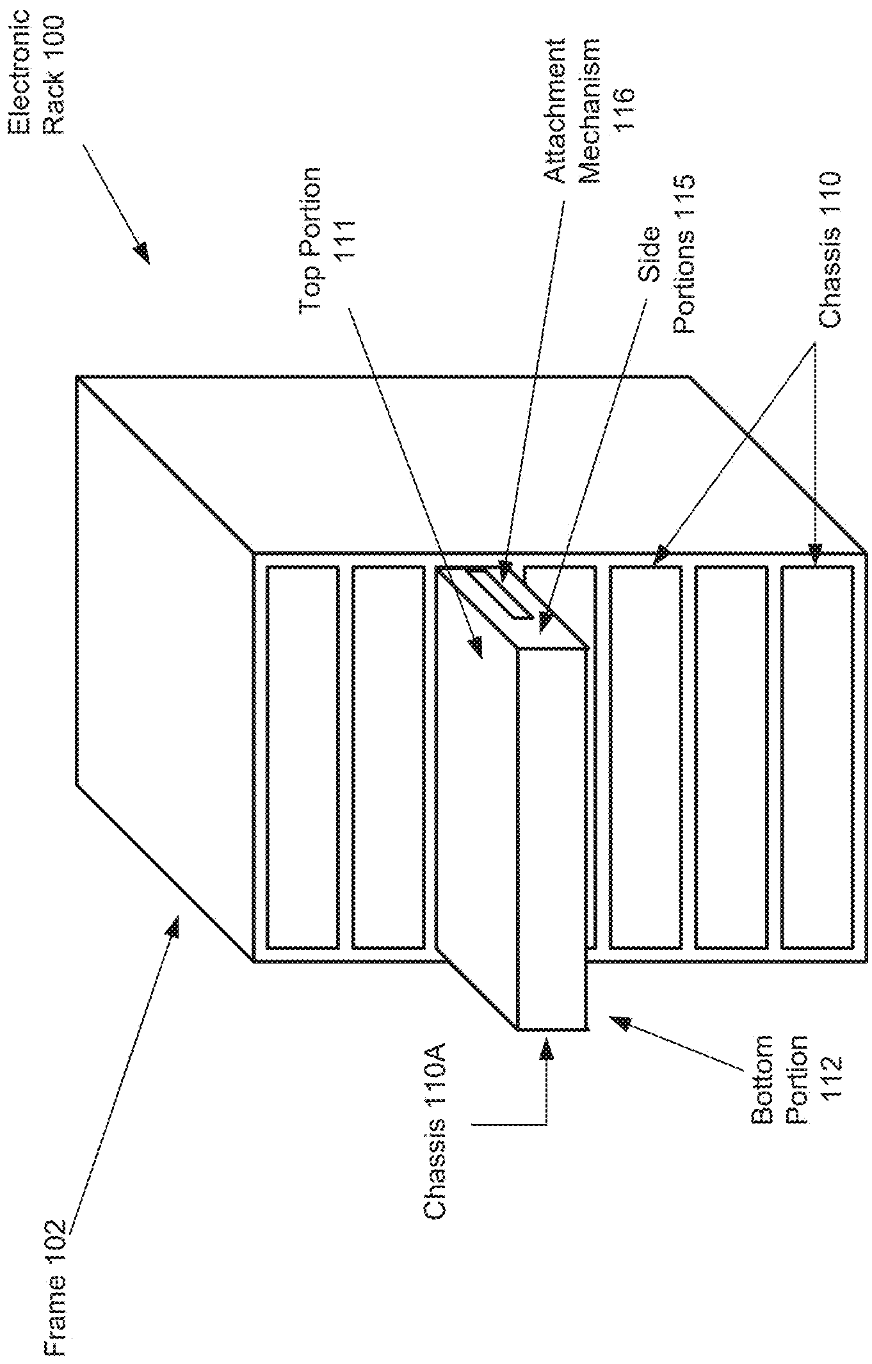
Figure 2B:
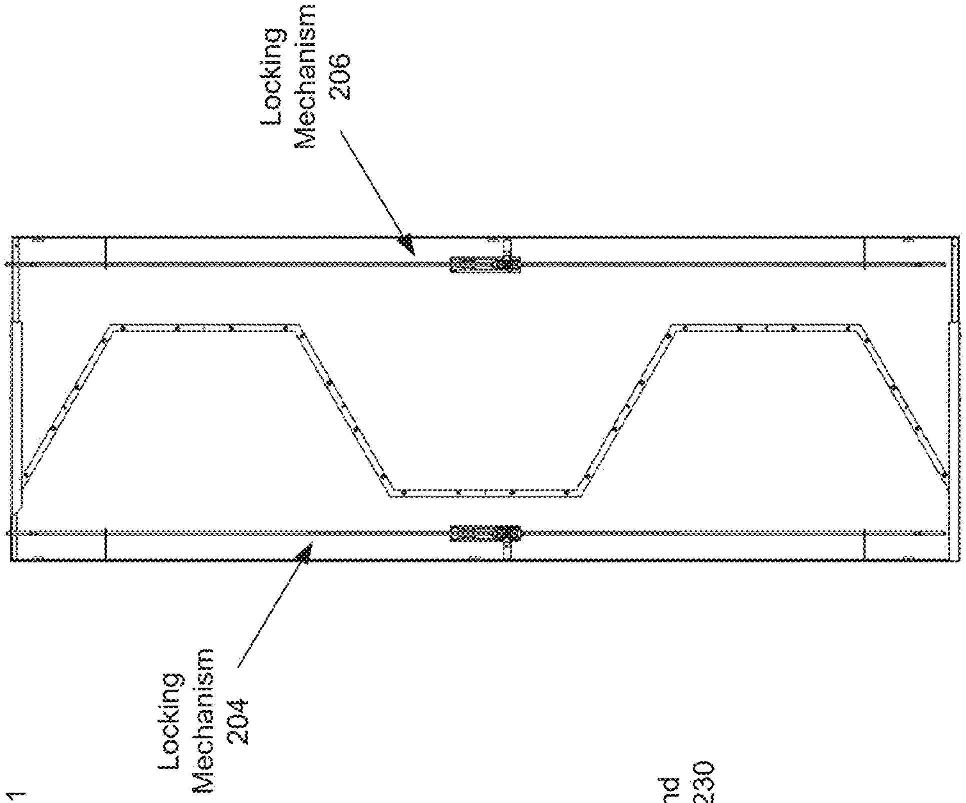
FIGS. 2A-2G show diagrams illustrating portions of an electronic rack in accordance with an embodiment.

Turning to FIGS. 1A-1B, diagrams illustrating electronic rack 100 in accordance with an embodiment is shown. In FIG. 2B, electronic rack 100 is illustrated without rack door 101. Electronic rack 100 may be used to store computing devices within one or more chassis 110. Chassis 110 may be physical devices for housing components such as computing devices.

The computing device housed in chassis 110A may include one or more components. The component may include, for example, hardware components that vary in size and number, with any of the hardware components varying in shape, performance, functionality, and/or other characteristics. In an embodiment, the hardware components include one or more of the following types of components: (i) memory modules such as random access memory (RAM), (ii) processing devices such as a central processing unit (CPU), (iii) storage devices such as hard disk drives, solid state drives, etc., and/or (iv) input and output (I/O) devices. The hardware components may include different types of devices without departing from embodiments disclosed herein.

One or more of chassis 110, such as chassis 110A, within electronic rack 100 may include top portion 111, bottom portion 112, side portions 115, and/or one or more of attachment mechanism 116. Each of these portions of a chassis is discussed is discussed below.

Top portion 111 may provide a portion of a housing to protect components within chassis 110. Top portion 111 may be implemented with, for example, a sheet of material. In an embodiment, top portion 111 is removable or adjustable to allow access to an interior of the housing for accessing components positioned there.

Bottom portion 112 may provide a second portion of the housing. In an embodiment, chassis 110 within electronic rack 100 may include two or more side portions 115 (e.g., on opposite sides of an interior of the housing). Bottom portion 112 may be implemented with, for example, a sheet of material.

Side portions 115 may provide portions of the housing. Side portions 115 may be implemented with sheets of material. Side portions 115 may be reversibly and/or permanently attached to top portion 111 and/or bottom portion 112 to bound corresponding sides of the housing.

In an embodiment, an attachment mechanism (e.g., 116) is positioned with one or more of side portions 115. Attachment mechanism 116 may provide for reversible attachment of a chassis to frame 102 of electronic rack 100. Attachment mechanism 116 may also allow for translation of a chassis into and/or out of electronic rack 100. For example, attachment mechanism 116 may be implemented with a sliding joint that allows, while a chassis is attached to electronic rack 100 through the sliding joint, translation (e.g., to a limited degree) of the chassis into and out of an interior of electronic rack 100 through a corresponding opening in electronic rack 100. While illustrated in FIG. 1 with a specific position, any number of attachment mechanisms may be positioned with different portions of a chassis to facilitate positioning, orienting, and/or managing of chassis with electronic rack 100.

In an embodiment, electronic rack 100 includes openings and/or corresponding attachment points for attachment mechanisms of chassis 110 to stack any number of chassis 110 with respect to one another. Thus, any number of chassis 110 may be attached to frame 102 via corresponding attachment mechanisms.

To manage physical access to chassis 110, electronic rack 100 may include rack door 101. Rack door may be a physical structure that may attach to frame 102 and/or other components of electronic rack 100 via hinges or other attachment mechanisms. Rack door 101 may include a front side (e.g., 120) through which flows of cooling gasses may pass, but may prevent hands, tools, or other structures from passing through front side 120.

To restrict access to chassis 110, rack door 101 may need to be complementary to a width of frame 102. For example, rack door 101 may have a width that is similar to a width of frame 102 and/or chassis 110. Consequently, when in a closed position, rack door 101 may cover and prevent physical access to a chassis 110 from a front side of electronic rack 100.

However, if rack door 101 is of a width that is not complementary to the width of frame 102 and/or chassis 110, then some portions of chassis 110 may be exposed rack door 101 is in a closed position and/or rack door 101 may not be able to secure itself to frame 102 while in the closed position (e.g., may be too wide).

To facilitate use of rack doors, rack door 101 may be adjustable to be complementary to frames of electronic racks. For example, rack door 101 may have a width that may be adjusted so that it is complementary to a width of frame 102, chassis 110, etc. Additionally, rack door 101 may include (i) actuation features such as handles that may be repositioned to different areas of rack door 101, (ii) locking mechanisms that may be repositioned, and (iii) attachment features that may be repositioned. The repositionability of these features may allow rack door 101 to be used in (a) left side opening data center architectures (e.g., hinges on right sides of doors), (b) right side opening data center architectures (e.g., hinges on left sides of doors), and (c) mixed data center architectures (e.g., intermixed left and right side opening electronic racks).

Figure 2A:
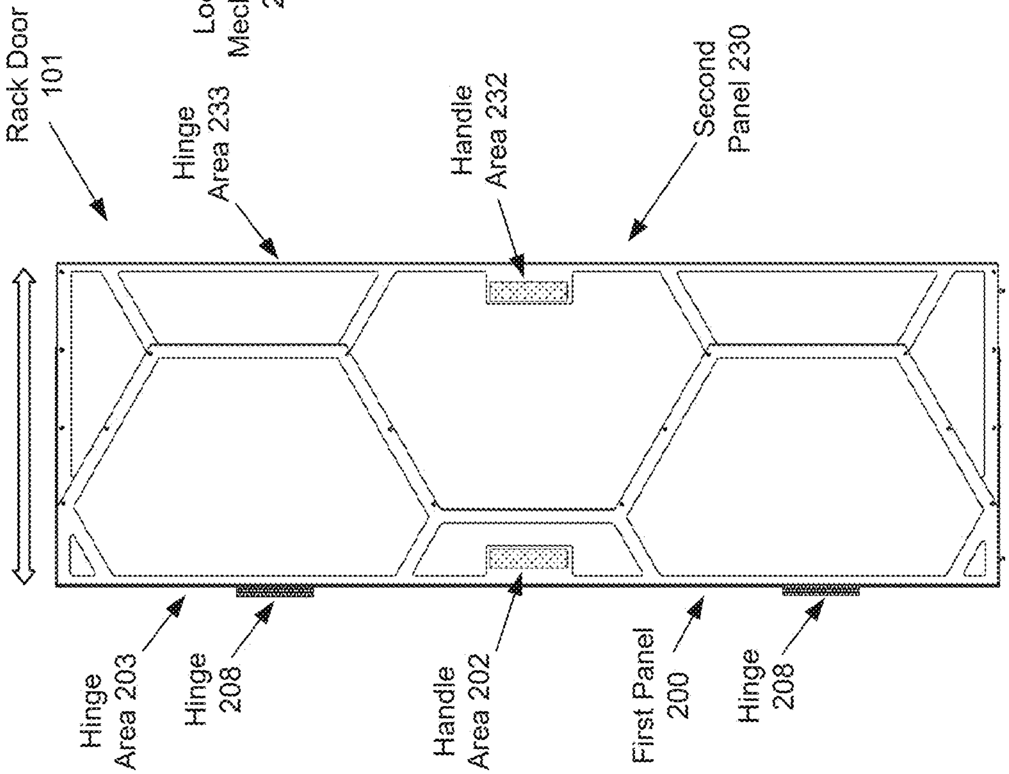

Refer to FIGS. 2A, 2C, 2D, 2E, and 2F for additional details regarding adjustment of the width of rack doors. Refer to FIGS. 2A and 2B for additional information regarding repositionability of features of rack door 101.

While illustrated in FIGS. 1A-1B with respect to a limited number of specific components in specific positions and orientations, an electronic rack may include different number and/or types of components with different positions and/or orientations without departing from embodiments disclosed herein.

Turning to FIGS. 2A-2B, diagrams illustrating rack door 101 in accordance with an embodiment are shown. In FIG. 2A, a front view diagram is shown (e.g., looking toward front side 120) and in FIG. 2B a rear view diagram of rack door 101 is shown.

To provide its functionality, rack door 101 may include first panel 200 and second panel 230. Each of the panels (e.g., 200, 230) may be physical structures that may limit physical access to chassis 110. The panels may be connected to one another in different configures to establish different widths of rack door 101. The panels may overlap one another different amounts in the different configurations to facilitate changes in width of rack door 101. For example, in FIG. 2A rack door 101 is illustrated as having a first width. However, adjustment of the positioning of the panels may enable the width of rack door 101 to be modified, as illustrated in FIGS. 2F-2G. Accordingly, the width of rack door 101 may be modified so that it is complementary to a frame. Refer to FIGS. 2C-2G for additional information regarding adjustment of the width of rack door 101.

To facilitate repositioning of handles, rack door 101 may include handle areas (e.g., 202, 232) on each panel. The handle areas may enable handle assemblies (e.g., handles, connection assemblies, etc.) to be positioned with either handle area, and/or to receive blank assemblies that fill in and/or otherwise close handle areas in which handles are not positioned.

A handle, when positioned in either handle area, may be mechanically coupled to a corresponding locking mechanism (e.g., 204, 206). In FIG. 2B, two locking mechanisms are illustrated. However, it will be appreciated that in practice only one locking mechanism may be present (e.g., may corresponding to in which handle area a handle assembly is positioned.

The locking mechanism may include locking bars that may reversibly secure an end of rack door 101 that is away from hinges that attack the rack door to the frame. In FIG. 2B, these locking bars are illustrated as being aligned from top to bottom with rack door 101, and may extend above/below rack door 101 when securing rack door 101 to a frame (e.g., the frame may include receptacles such as holes for the locking bars).

The locking mechanism or corresponding handle assembly positioned in a handle area may include a keyed lock that may fix the locking mechanism in place, and unfix the locking mechanism. When fixed, the locking bars may not move when force is applied to a corresponding handle, and may move when not fixed. Thus, a corresponding key may be used to reversibly secure rack door 101 in place.

For example, hinges (e.g., 208, may be placed in hinge area 233 rather than hinge area 203) placed in one of hinge areas 203, 233 (e.g., one side of rack door) and that attach rack door 101 to a frame may generally allow for rack door 101 to swing open or closed. The locking mechanism may prevent such swinging thereby reversibly securing rack door 101 in place.

Figure 2C:
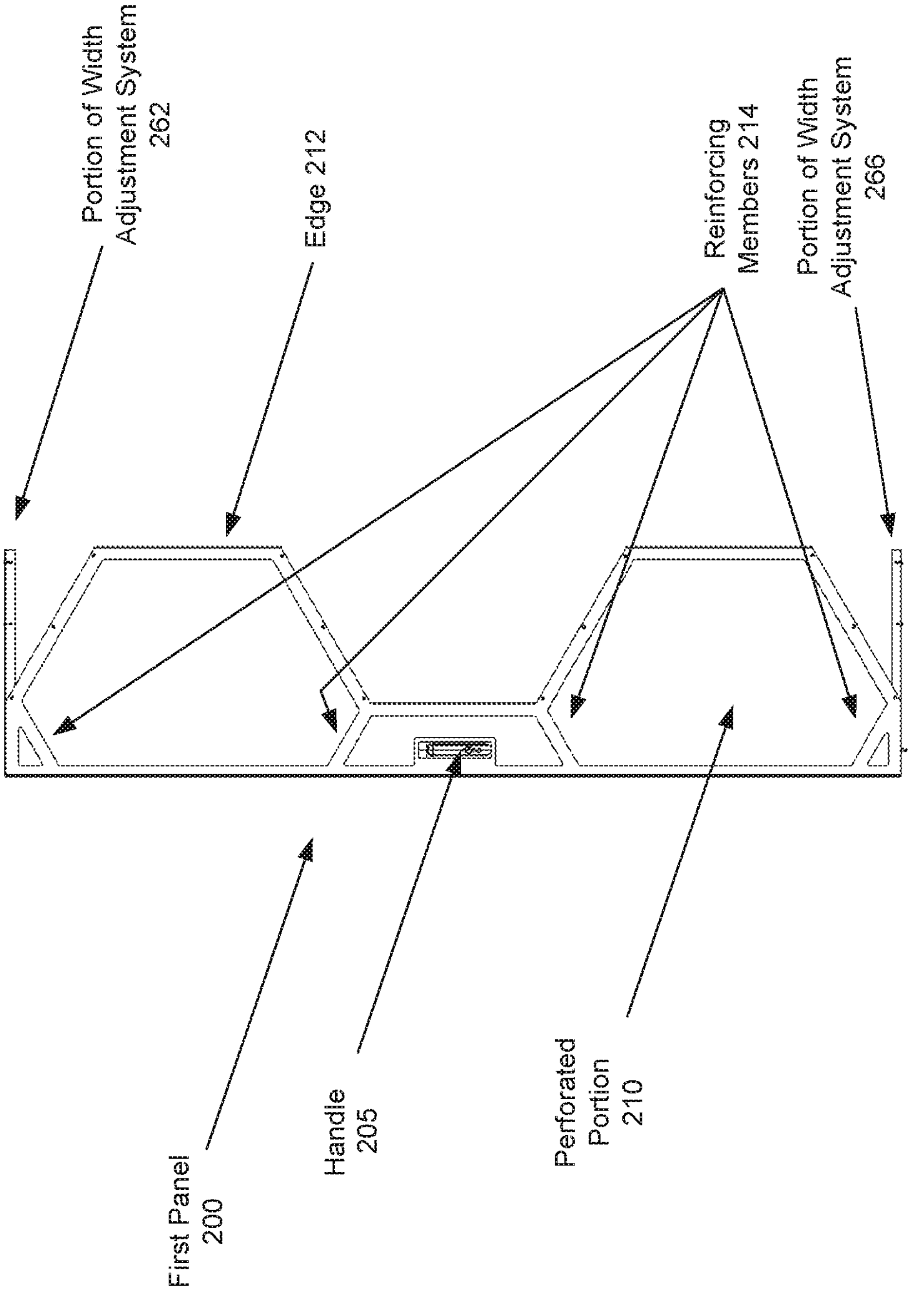
Figure 2D:
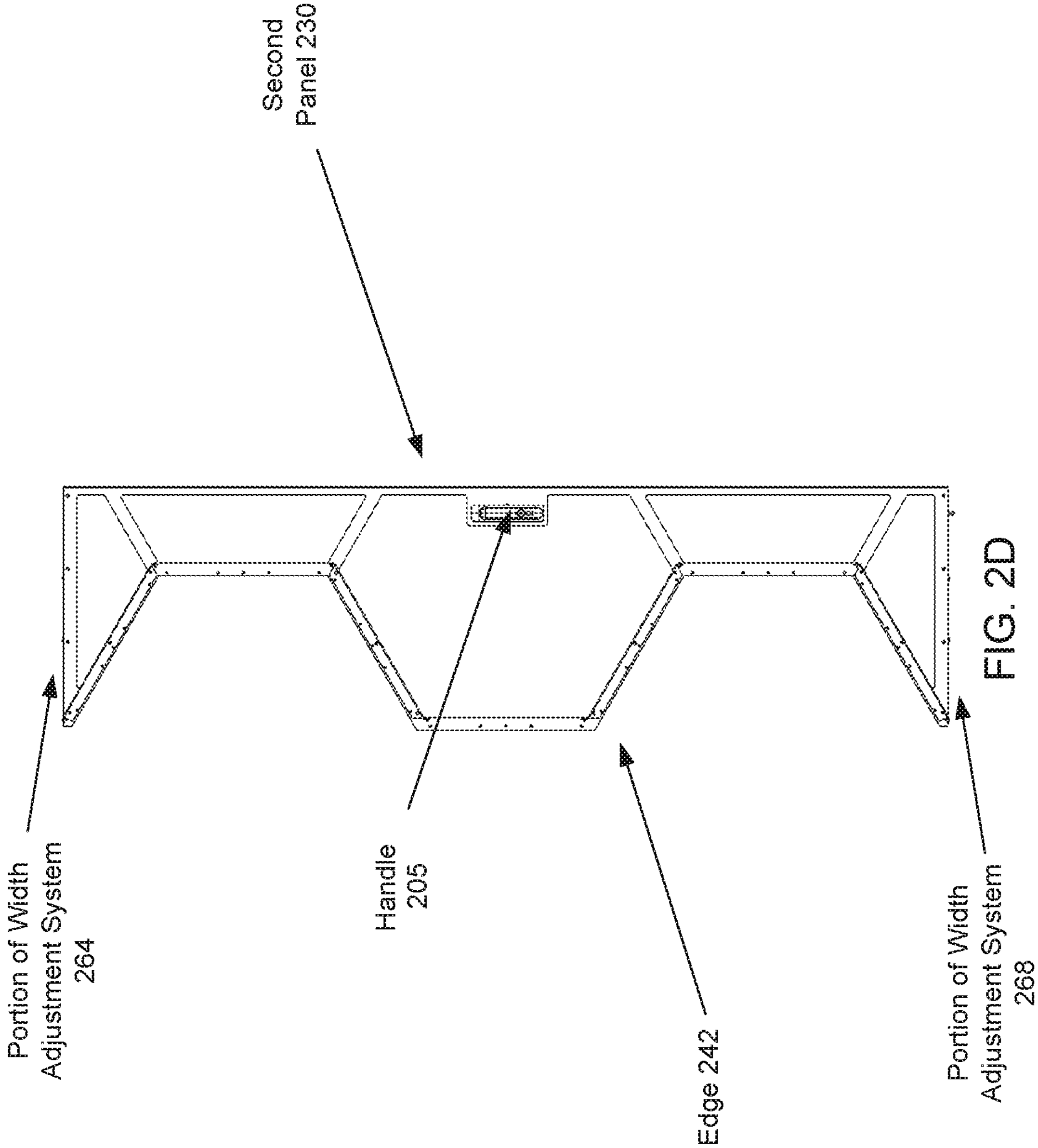

Turning to FIGS. 2C-2D, diagrams illustrating panels of rack door 101 in accordance with an embodiment are shown. In FIG. 2C, a front view diagram of first panel 200 is shown (e.g., looking toward front side 120) and in FIG. 2D a front view diagram of second panel 230 is shown.

To provide its functionality, first panel 200 may include any number of perforated portions (e.g., 210), edge 212, reinforcing members 214, and various portions of width adjustment systems (e.g., 262). Each of these is discussed below.

Perforated portion 210 may include a perforated sheet of metal, or other structural material that allows air to flow through it while prevent objects from moving through it. While described as perforated, it will be appreciated that the sheet of metal or other structural material may not be perforated. The perforations in perforated portions 210 may include any number and distribution of holes of any size (e.g., may be similar or different).

Edge 212 may delineate an exterior side of first panel 200, and may include structural members such as bars, tubes, channel, and/or other structural elements having similar or different sizes. Edge 212 may be complementary to edge 242 of second panel 230. For example, edge 212 and edge 242 may generally be aligned (e.g., stacked on top, when viewing front side 120) with one another while the width of rack door 101 is set to a particular width (e.g., maximum). Edge 212 and Edge 242 may generally not be aligned with one another while the width of rack door 101 is set to other widths.

For example, FIG. 2A illustrates edge 212 and edge 242 as being aligned, while FIG. 2F illustrates edge 212 and edge 242 as not being aligned due to the different settings of the width of rack door 101 in these respective example figures.

Generally, edge 212 and edge 242 may follow a honeycomb pattern (e.g., an outline of some number of cells of the pattern). In FIG. 2C, for example, the perforated portions may be within each cell of the honeycomb pattern, and edge 212 may follow the edge of several cells of the honeycomb pattern. The edges may, for example, follow the edge of three cells of the honeycomb pattern vertically from a bottom to a top of rack door 101. However, edge 212 and edge 242 may follow other patterns without departing from embodiments disclosed herein.

Reinforcing members 214 may include structural members such as bars, tubes, channel, and/or other structural elements having similar or different sizes. The structural members may be attached to portions of edge 212 and the perforated portions. The structural members may reinforce the structure of first panel 200 to limit bowing and/or other deformations of the perforated portions within prescribed limits, to enable attachment of handles and/or other structures to first panel 200, and/or provide other structural purposes. A portion of reinforcing members 214 may run next to hinge area 203 (e.g., hinge area 203 may be a surface of one or more of reinforcing members 214).

To facilitate modification of the width of rack door, first panel 200 may include portions of width adjustment systems (e.g., 262, 266). For example, a first width adjustment system may be positioned at a top of first panel 200 and a second width adjustment system may be positioned at a bottom of first panel 200.

Portion of width adjustment system 262 of first panel may include, for example, a portion of an expandable structural member. The expansion and/or contraction of the structural member may reposition first panel 200 and second panel 230 with respect to one another. Portion of width adjustment system 266 may include similar adjustable structural members. Complementary portions of width adjustments systems (e.g., 264, 268) of second panel 230 may cooperate with the portions of with adjustment systems of first panel to adjust the width of rack door 101.

In FIGS. 2C and 2D, example handles 205 are shown as being positioned in the corresponding handle areas.

Figure 2E:
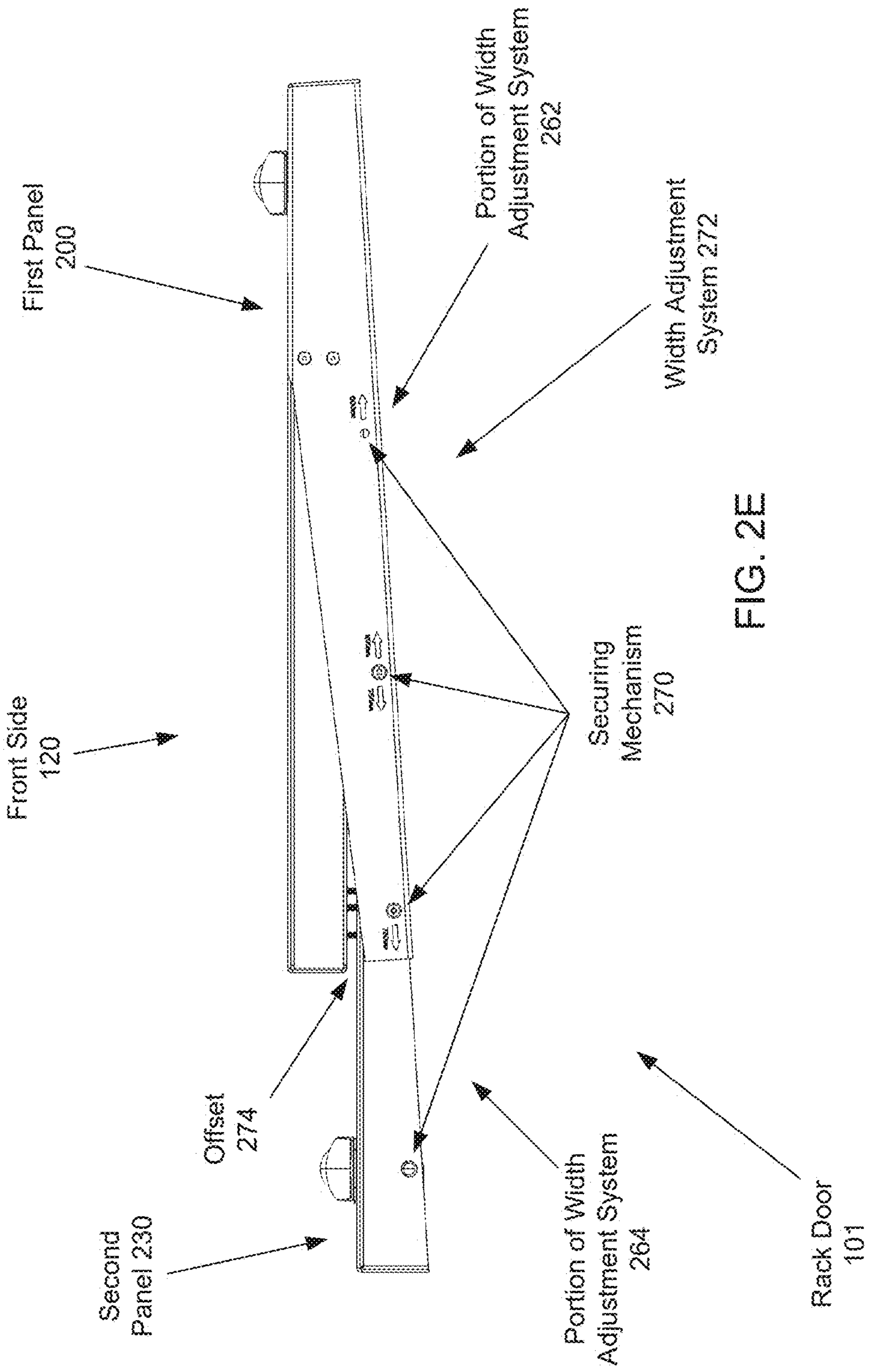
Figure 2F:
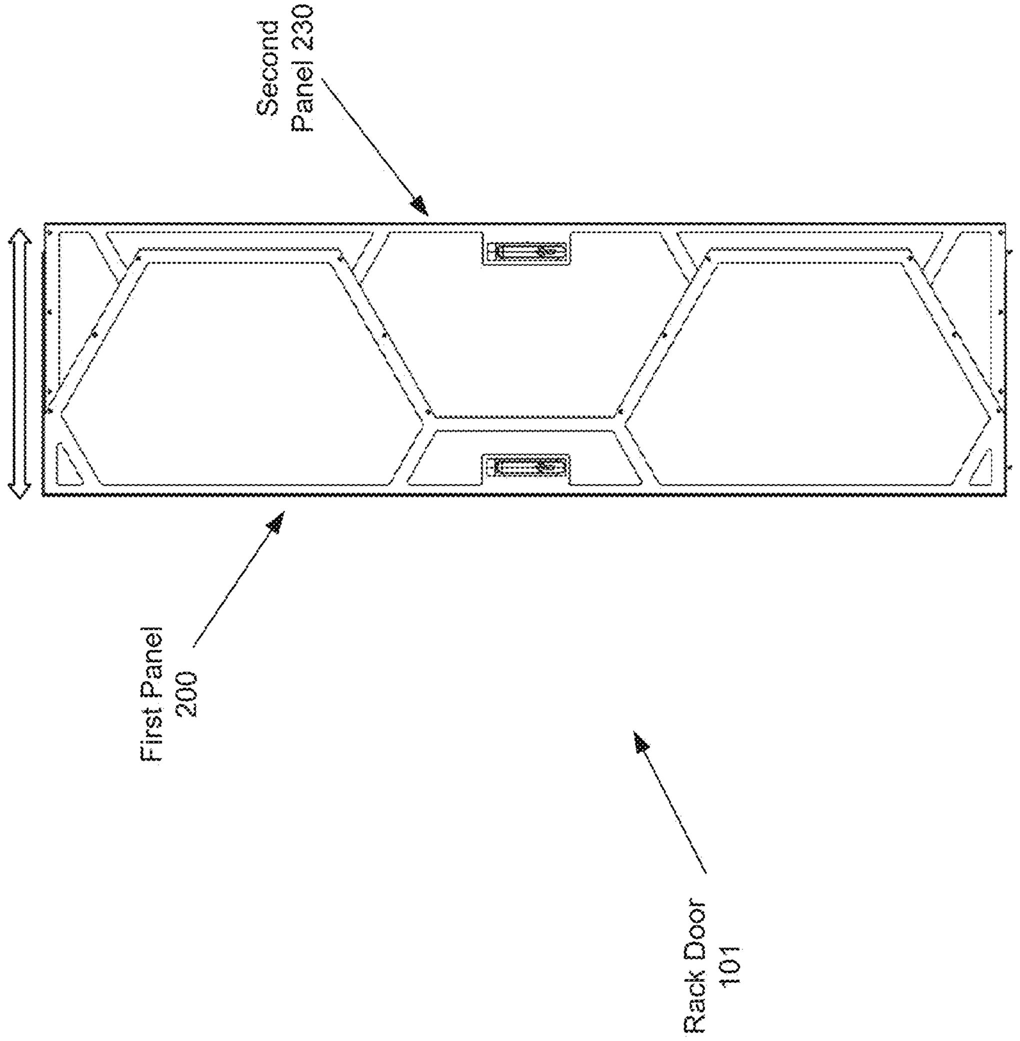
Figure 2G:
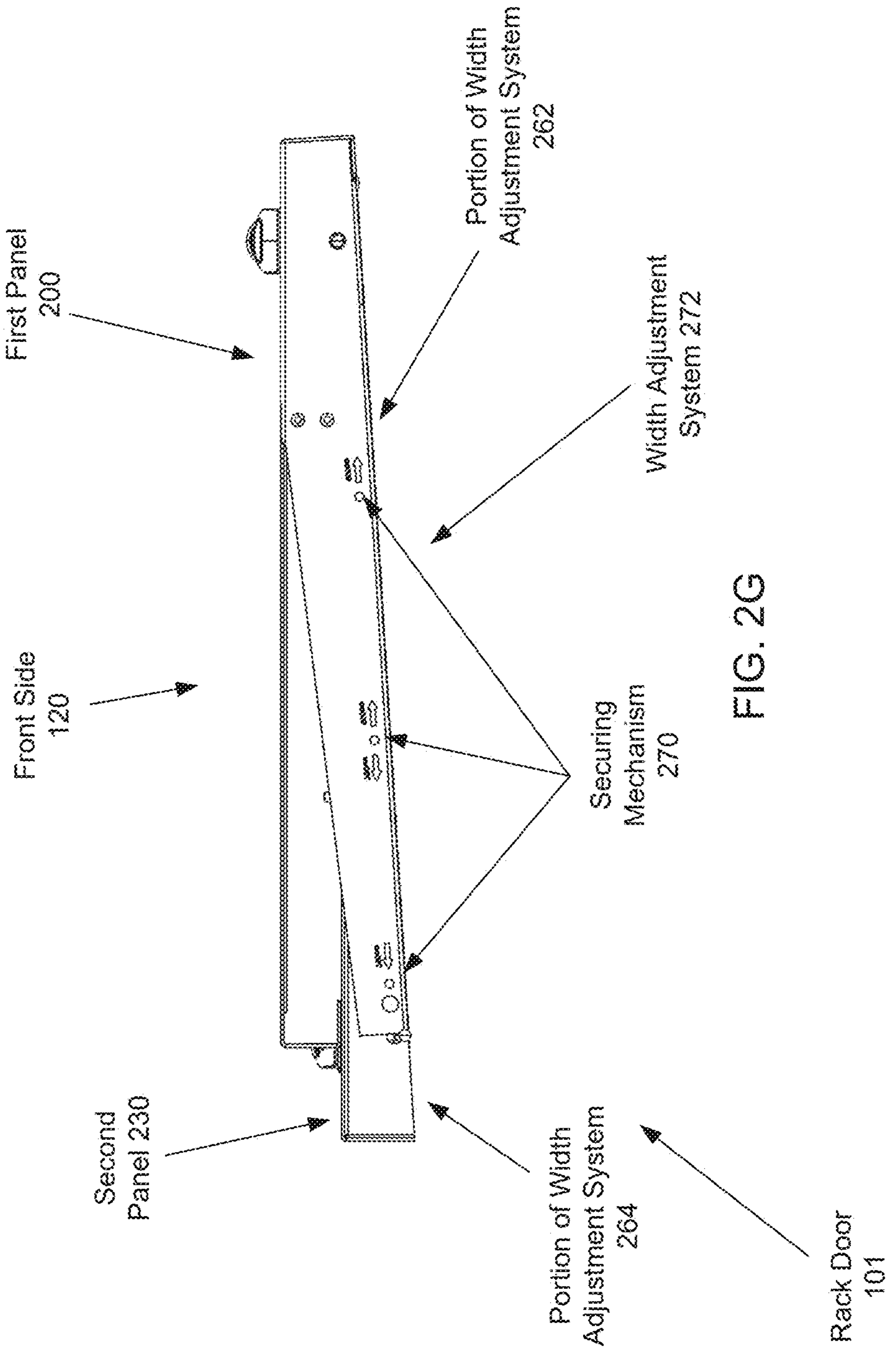

Turning to FIG. 2E, a top view diagram of rack door 101 in accordance with an embodiment is shown. The front side 120 of rack door 101 may be facing a top of the page in FIG. 2E.

To adjust the width of rack door 101, width adjustment system 272 (e.g., which may include 262, 264) may include securing mechanism 270. Securing mechanism may enable portion of width adjustment system 262 and portion of width adjustment system 264 to be reversibly secured to one another.

In FIG. 2E, securing mechanism 270 is illustrated as including bolt holes and bolts. Thus, different sets of holes may be aligned and bolted together to adjust the width of rack door 101. However, it will be appreciated that other types of securing mechanisms may be used without departing from embodiments disclosed here. For example, a slot in one portion with holes in another portion may allow for reversible securing throughout a range a different widths rather than discrete sets of widths provided by two bolt hole patterns.

Turning to FIG. 2G, a top view diagram of rack door 101 in accordance with an embodiment is shown. The front side 120 of rack door 101 may be facing a top of the page in FIG. 2E.

In FIG. 2G, width adjustment system 272 has been adjusted to reduce a width of rack door 101. Consequently, as seen in FIG. 2G, first panel 200 may have a larger overlap with second panel 230.

Turning to FIG. 2F, a front view diagram of rack door 101 in accordance with an embodiment is shown. Like FIG. 2G, width adjustment system 272 has been adjusted to reduce a width of rack door 101. Accordingly, as seen, the width of rack door 101 is now a second width that is smaller than the first width.

Accordingly, using the rack door as illustrated in FIGS. 2A-2G, embodiments disclosed herein may enable the widths of rack doors to be customized to the widths of frames of electronic racks. Likewise, the handles, hinges, locking mechanisms, and/or other components may be repositioned to able left or right side opening of the rack door.

Figure 3:
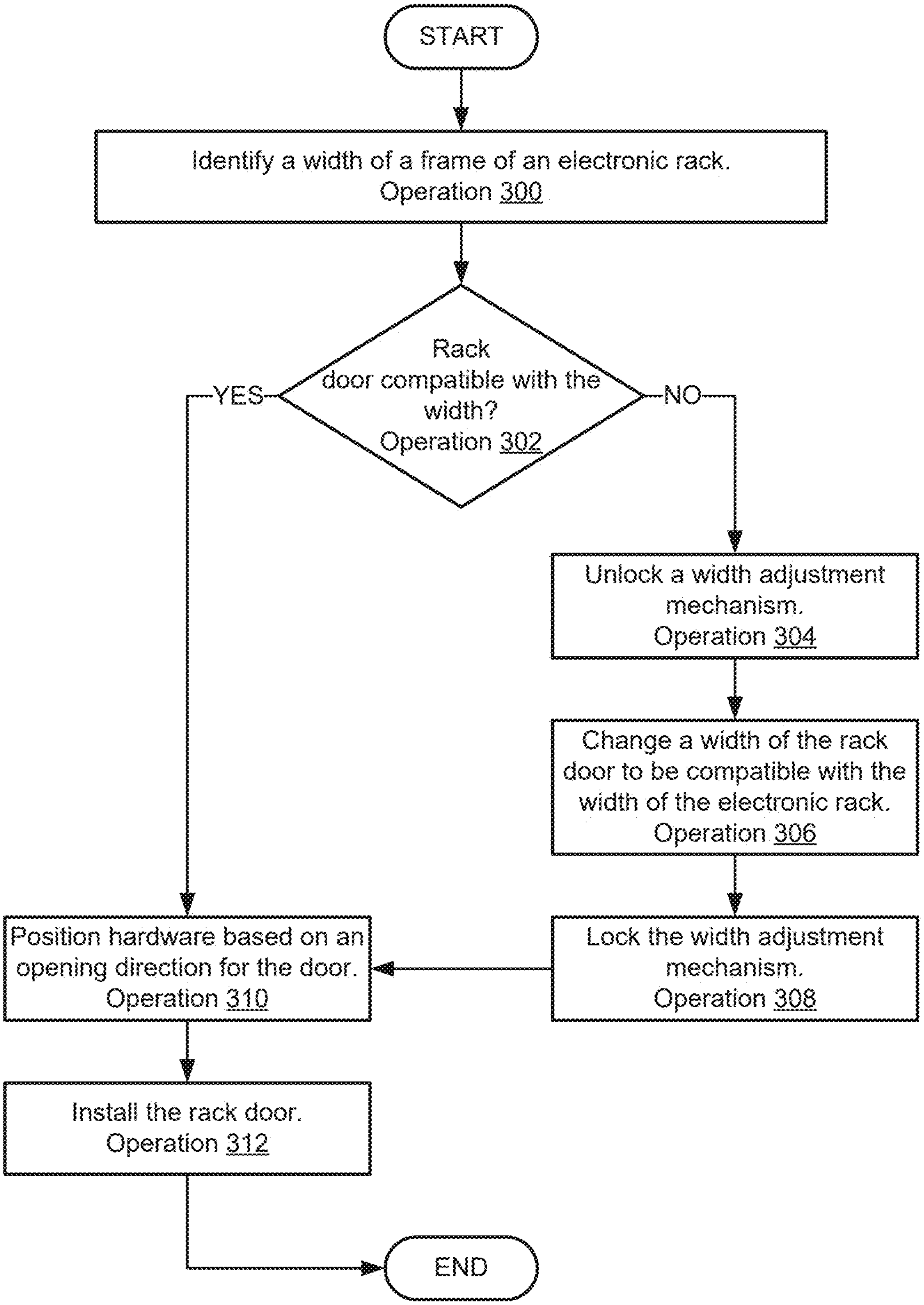
FIG. 3 shows a flow diagram illustrating a method of securing data processing systems in an electronic rack in accordance with an embodiment.

Rack doors, as discussed above, may be used to secure data processing systems in electronic racks. FIG. 3 illustrates a method that may be performed using the components of the system of FIGS. 1A-2G. In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method for securing data processing systems in accordance with an embodiment is shown.

At operation 300, a width of a frame of an electronic rack may be identified. The identification may be made, for example, by measuring the frame, reviewing specifications for the frame, and/or via other methods.

At operation 302, a determination is made regarding whether a rack door is compatible with the width. The determination may be made by comparing a current width of the rack door to the width of the frame. If the current with is the same or within a predefined different (e.g., 5% or another amount, may be based on tolerances, stack up considerations, etc.) from the width of the frame, then the rack door may be compatible with the width of the frame. Otherwise, the rack door, in its current configuration, may not be compatible with the width of the frame.

If the rack door is compatible with the frame, then the method may proceed to operation 310. Otherwise the method may proceed to operation 304.

At operation 304, a width adjustment mechanism of the rack door is unlocked. The width adjustment mechanism may be unlocked, for example, by loosening removing bolts or other types of fixation elements that attach two portions of the width adjustment mechanism.

At operation 306, a width of the rack door is changed to be compatible with the width of the electronic rack. The width may be changed by moving the two portions of the width adjustment mechanism with respect to one another to increase or decrease a length of the width adjustment mechanism.

At operation 308, the width adjustment mechanism may be locked. The width adjustment mechanism may be locked by securing the bolts and/or otherwise using fixation elements to lock the two portions of the width adjustment mechanism to one another.

At operation 310, hardware for the rack door is positioned based on an opening direction of the door. The hardware may be positioned by fixing it to corresponding portions of the rack door using fixation elements. For example, to open from a left side, hinges may be fixed to the right side, and handles/locking mechanisms may be fixed to the left side of the rack door.

At operation 312, the rack door is installed. The rack door may be installed, for example, by attaching the hinges and/or other portions of the rack door to a frame of the electronic rack.

The method may end following operation 312.

Figure 4:
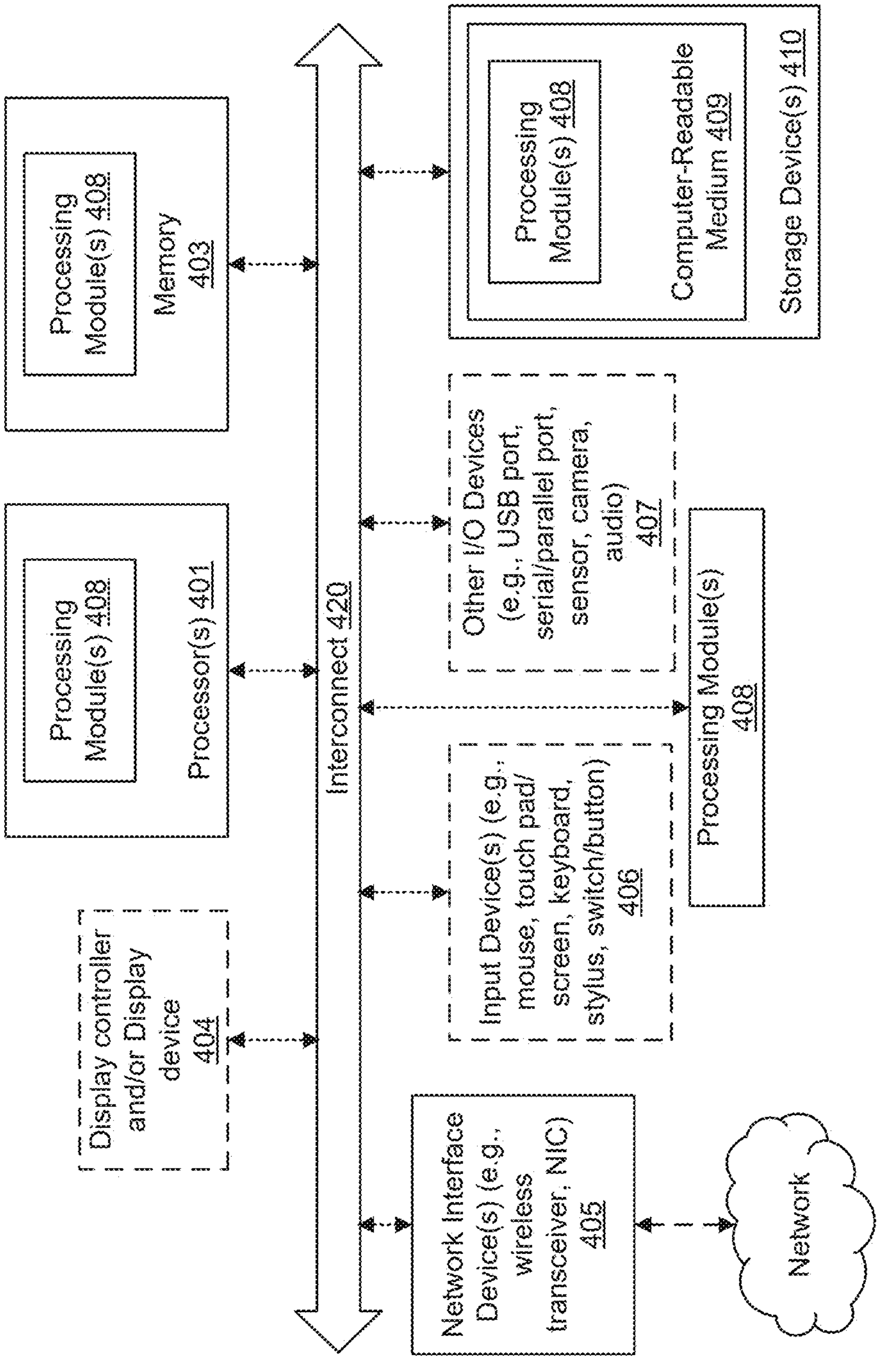
FIG. 4 show a diagram illustrating a data processing system in accordance with an embodiment.

Any of the components illustrated in FIGS. 1A-2G may be implemented with one or more computing devices. Turning to FIG. 4, a block diagram illustrating an example of a data processing system (e.g., a computing device) in accordance with an embodiment is shown. For example, system 400 may represent any of the data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term “machine” or “system” shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 420. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC).

Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 420 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 410 may include computer-readable storage medium 409 (also known as a machine-readable storage medium or a computer-readable medium) on which is stored one or more sets of instructions or software (e.g., processing module, unit, and/or processing module/unit/logic 408) embodying any one or more of the methodologies or functions described herein. Processing module/unit/logic 408 may represent any of the components described above. Processing module/unit/logic 408 may also reside, completely or at least partially, within memory 403 and/or within processor 401 during execution thereof by system 400, memory 403 and processor 401 also constituting machine-accessible storage media. Processing module/unit/logic 408 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 408, components and other features described herein can be implemented as discrete hardware components or integrated in the functionality of hardware components such as ASICS, FPGAs, DSPs or similar devices. In addition, processing module/unit/logic 408 can be implemented as firmware or functional circuitry within hardware devices. Further, processing module/unit/logic 408 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. An electronic rack, comprising:
- a frame comprising an area for housing chassis that are each adapted to house a respective data processing system; and
- a rack door that is attached to the frame and adapted to selectively restrict access to the area, the rack door comprising:
  - a first panel;
  - a second panel; and
  - at least one width adjustment system adapted to adjust a width of the rack door,
- wherein the at least one width adjustment system comprises:
  - a structural member of the first panel that has a first depth, in a direction perpendicular to a plane of the first panel, that is greater than a depth of the first panel;
  - a structural member of the second panel; and
  - a securing mechanism to reversibly fixedly attach the structural member of the first panel to the structural member of the second panel, an axis of the securing mechanism is aligned at an acute angle relative to a front face of the first panel, and
- wherein, from a top view of the rack door, the structural member of the first panel includes:
  - a front edge that is aligned parallel with the front face of the first panel; and
  - a rear edge that is aligned at the acute angle relative to the front face of the first panel such that the structural member of the first panel extends behind the front face of the first panel at the acute angle.

2. The electronic rack of claim 1, wherein the first panel comprises:
- a perforated portion; and
- an edge that is connected to and delineates the perforated portion.

3. The electronic rack of claim 2, wherein the perforated portion comprises:
- a perforated sheet metal,
- wherein the edge comprises a reinforcing member that retains a shape of the perforated sheet metal.

4. The electronic rack of claim 1, wherein the at least one width adjustment system is adapted to adjust the width of the rack door between a first width and a second width.

5. The electronic rack of claim 4, wherein while the width of the rack door is adjusted to the first width, a first edge of the first panel is aligned with a second edge of the second panel.

6. The electronic rack of claim 5, wherein while the width of the rack door is adjusted to the first width, a perforated portion of the first panel does not overlap with a perforated portion of the second panel.

7. The electronic rack of claim 6, wherein while the width of the rack door is adjusted to the second width, the first edge of the first panel is not aligned with the second edge of the second panel.

8. The electronic rack of claim 7, wherein while the width of the rack door is adjusted to the second width, the perforated portion of the first panel at least partially overlaps with the perforated portion of the second panel.

9. The electronic rack of claim 1, wherein the at least one width adjustment system comprises two width adjustment systems, a first of the two width adjustment systems being positioned with a top of the first panel and a top of the second panel, and a second of the two width adjustment systems being positioned with a bottom of the first panel and a bottom of the second panel.

10. The electronic rack of claim 1, wherein the rack door further comprises:
- a handle movable between a first handle area of the first panel and a second handle area of the second panel.

11. The electronic rack of claim 10, wherein the rack door further comprises:

a locking mechanism adapted to:

be positioned with the first handle area and the second handle area, and reversibly fixedly secure the rack door to the frame.

12. The electronic rack of claim 1, wherein, from the top view of the rack door, the structural member of the second panel includes:

a front edge that is aligned parallel with a front face of the second panel; and a rear edge that is aligned at the acute angle relative to the front face of the second panel such that when the first panel and the second panel are fixedly attached by the securing mechanism, the first panel and the second panel are parallel.

13. The electronic rack of claim 4, wherein while the width of the rack door is adjusted to the first width, the first panel is separated from the second panel in the direction perpendicular to the plane of the first panel by an offset gap, and while the width of the rack door is adjusted to the second width, the offset gap is eliminated in the direction perpendicular to the plane of the first panel such that the first panel contacts the second panel.

14. A rack door for an electronic rack, the rack door comprising:

a first panel;

a second panel; and at least one width adjustment system adapted to adjust a width of the rack door to conform to a width of the electronic rack, wherein the at least one width adjustment system comprises:

a structural member of the first panel that has a first depth, in a direction perpendicular to a plane of the first panel, that is greater than a depth of the first panel;

a structural member of the second panel; and a securing mechanism to reversibly fixedly attach the structural member of the first panel to the structural member of the second panel, an axis of the securing mechanism is aligned at an acute angle relative to a front face of the first panel, wherein a front side of the rack door is adapted to:

restrict physical access to an area of the electronic rack while the rack door is:

positioned with the electronic rack, and in a closed position, wherein, from a top view of the rack door, the structural member of the first panel includes:

a front edge that is aligned parallel with the front face of the first panel; and a rear edge that is aligned at the acute angle relative to the front face of the first panel such that the structural member of the first panel extends behind the front face of the first panel at the acute angle.

15. The rack door of claim 14, wherein the first panel comprises:

a perforated portion; and an edge that is connected to and delineates the perforated portion.

16. The rack door of claim 15, wherein the perforated portion comprises:

a perforated sheet metal, wherein the edge comprises a reinforcing member that retains a shape of the perforated sheet metal.

17. The rack door of claim 14, wherein the at least one width adjustment system is adapted to adjust the width of the rack door between a first width and a second width.

18. The rack door of claim 17, wherein while the width of the rack door is adjusted to the first width, a first edge of the first panel is aligned with a second edge of the second panel.

19. The rack door of claim 18, wherein while the width of the rack door is adjusted to the first width, a perforated portion of the first panel does not overlap with a perforated portion of the second panel.

20. The rack door of claim 19, wherein while the width of the rack door is adjusted to the second width, the first edge of the first panel is not aligned with the second edge of the second panel.

* * * * *